United States Patent [19]
Fulford, Jr. et al.

[11] Patent Number: 6,048,785
[45] Date of Patent: *Apr. 11, 2000

[54] SEMICONDUCTOR FABRICATION METHOD OF COMBINING A PLURALITY OF FIELDS DEFINED BY A RETICLE IMAGE USING SEGMENT STITCHING

[75] Inventors: H. Jim Fulford, Jr.; Robert Dawson, both of Austin; Mark I. Gardner, Cedar Creek; Frederick N. Hause, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[*] Notice: This patent is subject to a terminal disclaimer.

[21] Appl. No.: 08/876,628

[22] Filed: Jun. 16, 1997

[51] Int. Cl.[7] .............................................. H01L 21/4763
[52] U.S. Cl. .......................... 438/621; 438/629; 438/637; 438/946; 438/949
[58] Field of Search .................................... 438/637, 629, 438/946, 949

[56] References Cited

U.S. PATENT DOCUMENTS

| | | |
|---|---|---|
| 5,328,560 | 7/1994 | Hawana et al. . |
| 5,338,397 | 8/1994 | Sanders . |
| 5,733,798 | 3/1998 | Michael et al. . |
| 5,770,485 | 6/1998 | Gardner et al. . |
| 5,837,557 | 11/1998 | Fulford et al. . |

OTHER PUBLICATIONS

Silicon Processing for the VLSI ERA—vol. 1: Process Technology, by S. Wolf, published by Lattice Press, Sunset Beach, CA, 1986, pp. 182–327.
Silicon Processing for the VLSI ERA—vol. 2: Process Integration, by S. Wolf, published by Lattice Press, Sunset Beach, CA, 1990, pp. 124–131.

Primary Examiner—John F. Niebling
Assistant Examiner—Jonathan Hack
Attorney, Agent, or Firm—Skjerven, Morrill, MacPherson, Franklin, & Friel, LLP.; Ken J. Koestner

[57] ABSTRACT

Each region of multiple regions on a semiconductor substrate is imaged in an exposure field defined by a reticle. The regions are separated and electrically isolated within the semiconductor substrate by an isolation such as a field oxide or trench isolation. The regions are interconnected by imaging using a stitching reticle having an exposure field overlapping a plurality of the regions. The combination of reticle-imaged fields effectively increases the size of a field formed using a step and repeat technique while achieving high imaging resolution within the combined regions. Similarly, a plurality of integrated chip sets, including microprocessor, memory, and support chips, are constructed on a single semiconductor wafer using separate reticle imaging of each of the plurality of integrated chip sets. The different circuits are interconnected using a stitch mask and etch operation that combines the regions.

22 Claims, 5 Drawing Sheets

SEMICONDUCTOR FABRICATION METHOD OF COMBINING A PLURALITY OF FIELDS DEFINED BY A RETICLE IMAGE USING SEGMENT STITCHING

BACKGROUND OF THE INVENTION

1. Field of the Invention

The present invention relates to a method of integrated circuit manufacture. More specifically, the invention relates to a method of combining a plurality of semiconductor regions each defined by a reticle image.

2. Description of the Related Art

Integrated circuits are typically fabricated using photolithography techniques to produce a desired pattern from a photographic mask on a substrate material prior to a processing setup such as an etching step. Prior to photolithographic masking, a semiconductor wafer is cleaned, then covered with a solution of photoresist by spincoating, spraying or immersion. The solution is allowed to dry and then exposed to light or near ultraviolet radiation through the mask.

A photolithographic system for selectively irradiating a semiconductor wafer includes a radiation source, a lens or mirror and a mask or reticle. Photographic masks and photographic reticles are used to selectively pattern a semiconductor wafer. The mask and reticle differ in that a mask transfers a pattern onto an entire wafer in a single exposure. A reticle transfers a pattern onto only a portion of the wafer. In a photolithographic system that employs projection printing, the radiation source illuminates through the mask or reticle to the lens or mirror, and the lens or mirror focuses an image of the mask or reticle onto the photoresist coating of the semiconductor wafer.

One projection printing technique employs a projection scanner to transfer a pattern from a mask or reticle to a semiconductor wafer. The projection scanner uses a reflective spherical mirror to project an image onto a wafer by scanning the wafer and the mask with a narrow arc of radiation.

Another projection printing technique uses a step and repeat system, which is also called a stepper, to project an reticle image only onto a portion of the wafer. Multiple images of the reticle pattern are stepped and repeated over the entire wafer using multiple exposures. The reticle pattern is typically reduced 2× to 10× by the lens to form a small size but high-resolution image on the wafer surface, although non-reduction (1×) lens are available to cover a larger field on the wafer.

A photolithographic system uses an illumination source, such as a mercury-vapor lamp, to transfer a pattern to a wafer. A mercury-vapor lamp creates a discharge arc of high-pressure mercury vapor and emits a characteristic spectrum that contains several sharp lines in the ultraviolet region including the I-line at a wavelength of 365 nm, the H-line at a 405 nm wavelength and the G-line at a 436 nm wavelength. Generally photolithographic systems operate using the either the G-line, the I-line, a combination of the lines, or in the deep UV wavelengths of around 240 nm. A suitable illumination is attained using high power mercury-vapor lamps which draw 200 to 1,000 watts and generate an ultraviolet intensity of approximately 100 milliwatts/cm$^2$.

A typical reticle is constructed from glass with relatively defect-free surfaces and a high optical transmission at the radiation wavelength. Reticle glasses include soda-lime glass, borosilicate glass, and quartz. Quartz advantageously has a low thermal expansion coefficient and high transmission for near and deep ultraviolet light.

The term resolution refers to the ability of an optical system to distinguish closely spaced objects. The minimum resolution of a photolithographic system is the dimension of minimum linewidth or space that the system adequately prints or resolves. Optical photolithography currently attains a resolution of 0.35$\mu$ or less. Feature sizes approach 0.25$\mu$ and below with the features extending across wafer areas of a square inch and more. To improve resolution various alternative technologies are under development, including electron-beam, ion-beam, and x-ray technologies. These alternative technologies have achieved patterning capabilities that exceed limits of optical systems. Electron-beams and ion-beams can also directly write image patterns onto the photoresist without the use of a mask or reticle, for instance by using a controlled stage to position the wafer beneath the tool. However, these alternative approaches have certain drawbacks. For instance, electron-beam lithography has low throughput, x-ray lithography has difficulties with fabricating suitable masks, and ion-beam lithography has low throughput and difficulties with obtaining reliable ion sources.

One problem that arises with imaging of a wafer using a plurality of reticle images is the difficulty of achieving a suitable registration between the image fields on the semiconductor wafer. In particular, structures in different reticle fields are typically connected by overlapping of continuous lines that span the exposure fields of several reticles. Errors in registration can cause a connecting line between exposure fields to become laterally displaced and, therefore, disconnected. For electrically conductive structures, such as polysilicon and conductive metals, that are intended to form a conductive loop in a continuous circuit, a disconnection between structures constitutes an open circuit. For an electrically conductive loop having a registration error that does not result in a disconnected but rather a significantly attenuated line width, the line resistance may be substantially elevated, thereby impacting the performance of the circuit. In addition, a metal line such as an aluminum line that is significantly narrowed may become susceptible to high resistance or open lines due to electromigration. Disconnected lines and narrowed lines caused by misregistration between reticle image fields are typically stitched by depositing metal contacts over the ends of line segments. This approach disadvantageously requires additional processing steps for depositing and etching the metal contacts.

Another problem arising with fabrication of circuits by imaging using reticle image fields is that substantial silicon area is lost at the boundaries between reticle imaging fields.

What is needed is a technique for stitching line segments defined by adjacent reticle image patterns projected onto a photoresist layer overlying a semiconductor wafer so that segments are suitably interconnected.

SUMMARY OF THE INVENTION

In accordance with the present invention, each region of multiple regions on a semiconductor substrate is imaged in an exposure field defined by a reticle. The regions are separated and electrically isolated within the semiconductor substrate by an isolation such as a field oxide or trench isolation. The regions are interconnected by imaging using a stitching reticle having an exposure field overlapping a plurality of the regions. The combination of reticle-imaged fields effectively increases the size of a field formed using a step and repeat technique while achieving high imaging resolution within the combined regions.

Also in accordance with an embodiment of the present invention, a plurality of integrated chip sets, including microprocessor, memory, and support chips, are constructed on a single semiconductor wafer using separate reticle imaging of each of the plurality of integrated chip sets. The different circuits are interconnected using a stitch mask and etch operation that combines the regions.

Many advantages are achieved by the disclosed method and apparatus. One advantage is that the interconnection of different reticle fields increases the effective size of a circuit while maintaining a high imaging resolution. Another advantage is that the combination of a plurality of imaged regions reduces the silicon area lost in the areas outside the individual imaged regions. A further advantage is that a plurality of different integrated circuits may be interconnected using the described method. For example, a semiconductor wafer may be fabricated including a microprocessor, memory and support chips. The individual circuits are connected using the described method so that a highly fictional combination circuit is constructed.

A further advantage is that interconnections are formed using the described method to supply a metal plug forming a low impedance local interconnect between source/drain regions of transistors. It is advantageous that interconnections are made between multiple integrated circuit devices and structures while maintaining a planar structure through multiple layers.

BRIEF DESCRIPTION OF THE DRAWINGS

The features of the described embodiments believed to be novel are specifically set forth in the appended claims. However, embodiments of the invention relating to both structure and method of operation, may best be understood by referring to the following description and accompanying drawings. The appended drawings illustrate the general concepts of a suitable fabrication method but are not necessarily drawn to scale. Analogous or similar structures may be designated by the same reference number in the drawings.

FIGS. 1A and 1B through 5A and 5B, are respectively a top plan view (FIGS. 1A through 5A) and a corresponding cross-sectional view (FIGS. 1B through 5B) showing successive processing steps of a method for stitching two circuit fields.

DETAILED DESCRIPTION OF THE PREFERRED EMBODIMENTS

Figure 1A:
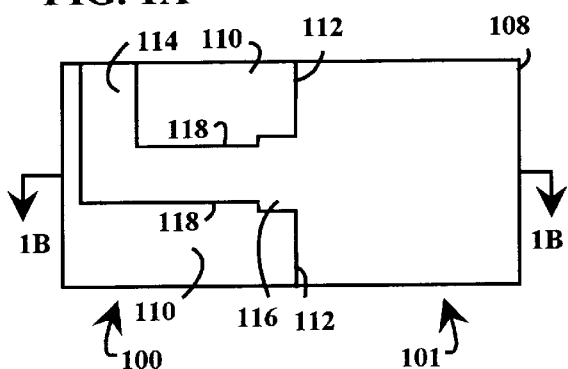
Figure 1B:
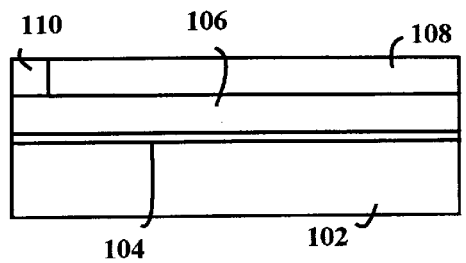

Referring to a sequence of paired FIGS. 1A and 1B through 5A and 5B, a top plan view (FIGS. 1A through 5A) and a corresponding cross-sectional view (FIGS. 1B through 5B) are illustrated for successive processing steps of a method for stitching two circuit fields, a field A 100 and a field B 101. In FIGS. 1A and 1B, a silicon substrate 102 is covered by a layer of gate oxide 104. Overlying the gate oxide 104 is a layer of polysilicon 106. A photoresist layer 108 is formed on the surface of the gate oxide layer 104. A first image pattern 110 is etched into the photoresist layer 108. The first image pattern 110 is bounded by an outer border 112 and defines a first segment 114 and a contact region 116 between irradiated regions of the first image pattern 110.

In one embodiment, the silicon substrate 102 is suitable for integrated circuit fabrication and includes a P-type epitaxial surface layer with a <100> orientation, a thickness of $8\mu$ and a resistivity of 12 $\Omega$-cm. The epitaxial surface layer is formed on a P+ base layer (not shown). The gate oxide layer 104 typically is composed from silicon dioxide and is formed on the top surface of the silicon substrate 102 using thermal oxidation in a diffusion tube at a temperature of from 700° C. to 1000° C. in an $O_2$ ambient. The gate oxide layer 104 typically has a thickness in a range from 30 Å to 150 Å. The polysilicon layer 106 is not doped and is deposited to a thickness of 1500 Å to 2500 Å by low pressure chemical vapor deposition on the surface of the gate oxide layer 104. The polysilicon layer 106 may be doped subsequently, either in situ during deposition or prior to etching, for example by implanting arsenic with a dosage in a range from $1\times10^{15}$ to $5\times10^{15}$ atoms/cm$^2$ and an energy in a range from 2 to 50 kiloelectron-volts. The photoresist layer 108 is typically deposited on the polysilicon layer 106 as a continuous layer and selectively irradiated using a photolithographic system (not shown), such as a step-and-repeat optical projection system. The step-and-repeat optical projection system, for example, may project I-line ultraviolet light from a mercury-vapor lamp through a reticle and a focusing lens to illuminate the first image pattern 110 on the photoresist layer 108. In other embodiments, other illuminating systems such as electron-beam and x-ray illumination systems may be employed, depending on the integrated circuits to be fabricated.

In one embodiment, the first segment 114 has a line width (LW) of about 3500 Å. The contact region 116 has a width (W) of about 5500 Å and a length (L) of approximately 2000 Å. In the illustrative embodiment, the first segment 114 is centered in the y-direction with respect to the contact region 116 so that the contact region 116 protrudes about 1000 Å beyond adjoining sidewalls (not shown) of the first segment 114.

Figure 2A:
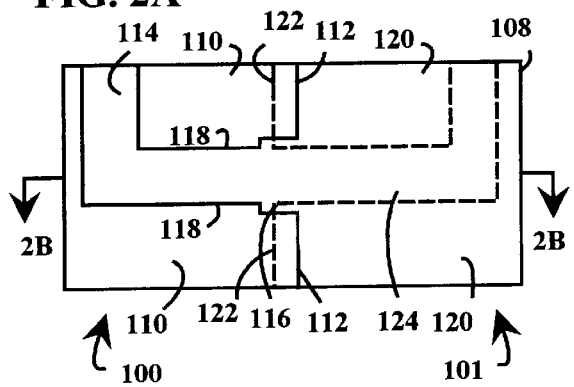
Figure 2B:
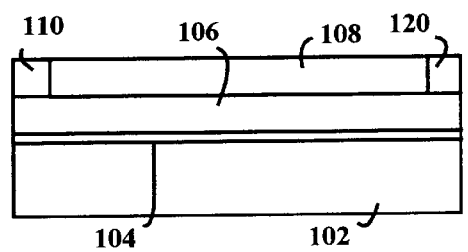

The irradiation for projecting the first image pattern 110 is terminated and, in a second irradiation step shown in FIGS. 2A and 2B, the photoresist layer 108 is again selectively irradiated, for example using the step and repeat system, and a second image pattern 120 is projected onto the photoresist layer 108. Thus the first image pattern 110 and the second image pattern 120 are projected using separate exposure steps with the first image pattern 110 projected onto the photoresist layer 108, the exposure discontinued, and then the second image pattern 120 is projected onto the photoresist layer 108. The second image pattern 120 has an outer border 122 and defines a second segment 124 between irradiated regions of the second image pattern 120. One end of the second segment 124 is adjacent to the outer border 122. Outer borders 112 and 122 are mutually parallel and offset by a selected length in the x-direction so that image patterns 110 and 120 partially overlap between the outer borders 112 and 122. The first segment 114 and the second segment 124 are mutually misaligned with respect to one another in both the x-direction and the y-direction. The second segment 124 is positioned to extend into the contact region 116 to form an electrical contact between the field A 100 and the field B 101.

In one embodiment, outer borders 112 and 122 are mutually parallel and offset by approximately 500 Å in the x-direction. First segment 114 and second segment 124 are displaced in the x-direction by approximately 1500 Å and displaced in the y-direction by about 500 Å so that the second segment 124 extends about 500 Å into the contact region 116 and is spaced from the upper edge of the contact region 116 by about 500 Å and spaced from the lower edge of the contact region 116 by about 1500 Å. The entire end of the second segment 124 overlaps the contact region 116 so that the contact region 116 accommodates the misalignment between the first segment 114 and the second segment 124 and assures that the stitching between segments 114 and 124 has a linewidth of about 3500 Å.

Figure 3A:
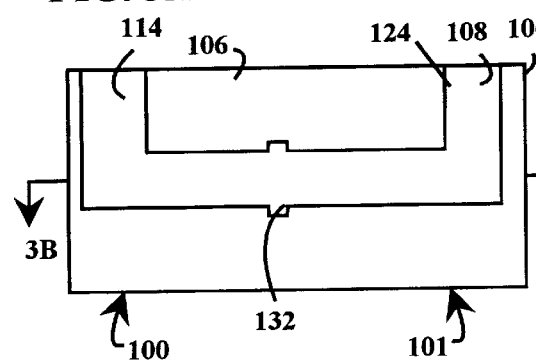
Figure 3B:
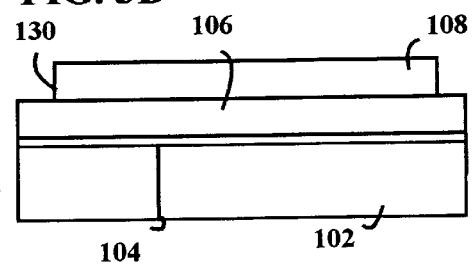

Referring to FIGS. 3A and 3B, the photoresist layer 108 is developed. The photoresist layer 108 is positive-acting so that portions of the photoresist layer 108 that are irradiated by the first image pattern 110, the second image pattern 120, or both image patterns 110 and 120 are removed. The removed areas of the photoresist layer 108 leave openings 130 that selectively expose a portion of the polysilicon layer 106 which correspond to the first image pattern 110 and the second image pattern 120. The portion of the photoresist layer 108 that remains after patterning covers the first segment 114, the second segment 124, and a portion 132 of the contact region 116. Portion 132 of the contact region 116 is outside the outer border 122. The portion 132 of the contact region 116 inside the outer border 122 corresponds, or is converted, to the end of the second segment 124, where the second segment 124 overlaps the contact region 116.

Figure 4A:
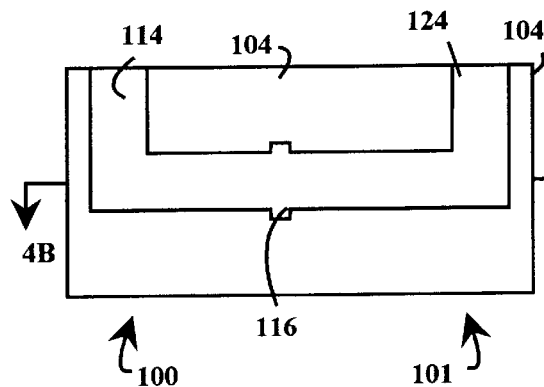
Figure 4B:
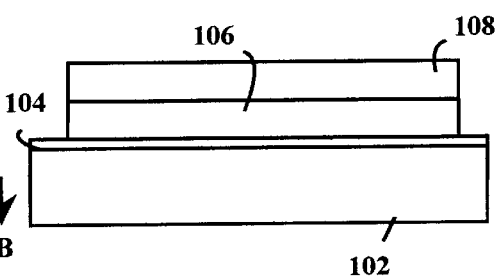

Referring to FIGS. 4A and 4B, an anisotropic dry etch that is highly selective of the polysilicon layer 106 is applied through the openings 130. The photoresist layer 108 protects the underlying polysilicon layer 106 from the etch while the exposed portion of the polysilicon layer 106 is etched and removed. The anisotropic etch is highly selective of polysilicon and non-selective of silicon dioxide so that only a negligible amount of the gate oxide layer 104 beneath the exposed portion of the polysilicon layer 106 is removed. The silicon substrate 102 is not etched by the anisotropic etch.

Figure 5A:
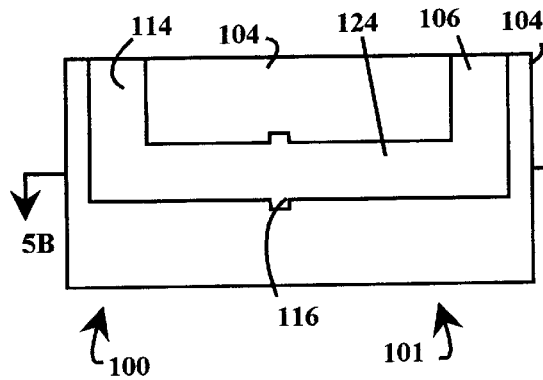
Figure 5B:
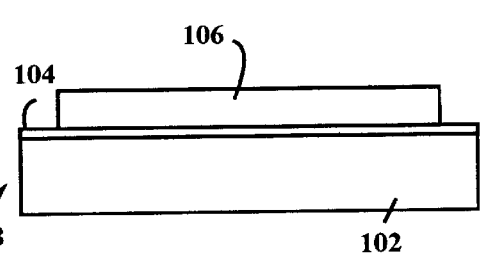

Referring to FIGS. 5A and 5B, the photoresist layer 108 is stripped. The first segment 114 and the second segment 124 are stitched by the portion 132 of the contact region 116 to form a continuous circuit despite possible misalignment between the segments 114 and 124. In one embodiment, the segments 114 and 124 are stitched to form a continuous minimum linewidth of approximately 3500 Å despite any misalignment between the segments.

Various other embodiments of the method disclosed in paired FIGS. 1A and 1B through 5A and 5B, which are described more fully in the copending U.S. Patent Application entitled, "Method of Stitching Segments Defined by Adjacent Image Patterns During the Manufacture of a Semiconductor Device," Ser. No. 08/805,534, naming H. Jim Fulford, Jr. et al. as inventors. In various embodiments, for example, the images for field A 100 and field B 101 are patterned in a reversed order. The first and second segments are formed in sequence using two photoresist layers, rather than being formed simultaneously using a single photoresist layer. In another embodiment, the segments and the contact region are fabricated as trenches formed in silicon beneath the image patterns, rather than protruding regions of polysilicon outside the image patterns.

Figure 6A:
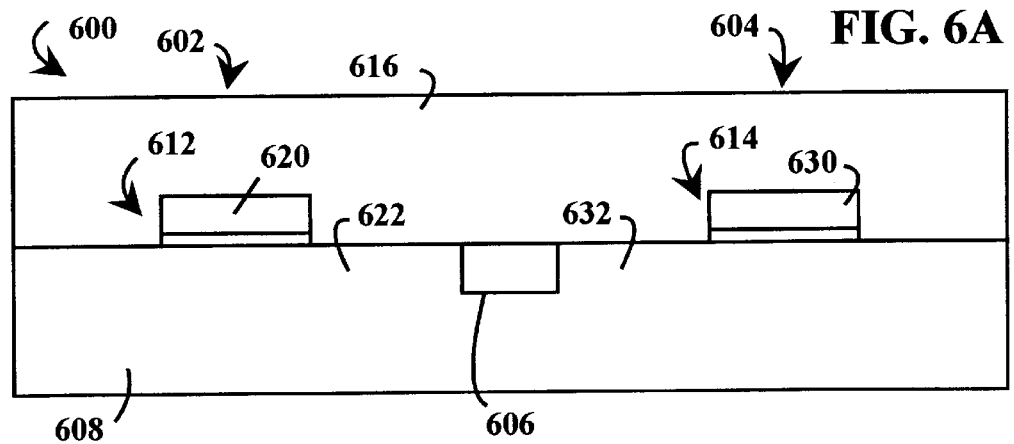
FIGS. 6A through 6E are a sequence of cross-sectional diagrams of a semiconductor wafer during processing for combining a plurality of fields defined by a reticle image using segment stitching.

FIGS. 6A through 6E are a sequence of cross-sectional diagrams of a semiconductor wafer 600 during processing for combining a plurality of fields defined by a reticle image using segment stitching. Referring to FIG. 6A, a cross-sectional view of a semiconductor wafer 600 shows a field A 602 and a field B 604. Field A 602 and field B 604 are formed using separate masking steps as is depicted in paired FIGS. 1A and 1B through 5A and 5B for one or more reasons. For example, field A 602 and field B 604 may be formed in different masking steps because the combination of fields is too large for masking using a single reticle. Alternatively, field A 602 and field B 604 may be fabricated using different resolution and quality reticles, or different layout rules, design rules or illumination technologies (for example, x-ray, ion-beam and electron-beam illumination). Furthermore, macrochips including a variety of circuit fields such as a microprocessor, a DRAM storage, an SRAM storage and the like may be fabricated using a plurality of reticles, masked and etched in separate processing sequences for the plurality of circuit fields. In other circuits, different circuit structures may be fabricated in the plurality of circuit fields such as a block of P-channel transistors and a block of N-channel transistors in a static RAM circuit.

Although each field typically includes a plurality of devices and structures, a transistor A 612 and transistor B 614 are shown in FIGS. 6A through 6E for illustrative purposes since a discussion of two devices fully but concisely describes the improved method.

Field A 602 and field B 604 are separated by an isolation 606 which in various embodiments is a trench isolation or a field oxide isolation. The isolation 606 is formed to mutually isolate the fields of a multiple-field semiconductor wafer. A field oxide isolation is formed by thermal growth on the silicon substrate 608, for example by wet oxidation at temperatures of around 1000° C. for 2 to 4 hours to grow field oxide thickness of $0.8\mu$–$1.0\mu$. A trench isolation may take the form of a single trench or multiple trenches. For example, if shallow trench isolation is used, multiple trenches are advantageously employed to assure a sufficient isolating fill. A trench or plurality of trenches is etched and the trenches are filled, for example using a LOCOS fill, a deposited fill, or a spin-on-glass (SOG) for filling narrow trenches. A suitable trench isolation has a width in a range from approximately $1.0\mu$ to about $100\mu$.

The devices, transistor A 612 and transistor B 614 are previously formed in different masking steps using suitable device processing steps including formation of gate oxide, gate polysilicon, source/drain and isolation. For example, in one embodiment the field A 602 is masked and etched in a first sequence of steps and the field B 604 is masked and etched in a second sequence of steps. Masking of field A 602 and field B 604 are mutually independent, by projecting radiation respectively through a reticle A (not shown) and, at a different time, through a reticle B (not shown). The reticle A and the reticle B are typically different reticles, although in some embodiments, the same reticle may be used to mask both field A 602 and field B 604, although separate mask steps are necessary since multiple exposures are used to form a desired circuit size. Both the printing of field A 602 and field B 604 are performed with a controlled registration tolerance.

The transistor A 612 includes a gate 620 and a source/drain region 622 implanted into a substrate 608. The transistor B 614 includes a gate 630 and a source/drain region 632 implanted into the substrate 608. A dielectric layer 616 is deposited overlying the devices transistor A 612 and transistor B 614. The dielectric layer 616 is deposited as a continuous layer overlying the silicon substrate 608.

In one embodiment, the gate is formed by applying a first photoresist mask on the gate material and etching a first portion of the gate material through the opening in the first mask. The first photoresist mask is then removed and a second photoresist mask is formed on the gate material so that a second portion of the gate material is etched through the opening in the second mask. In this embodied method, the first and second edges of the gate electrode are formed in sequence. An advantage of this etching procedure is that the gate electrode can have an extremely narrow length of approximately 0.1µ or less.

Following formation of the gate electrode, source and drain regions are formed by implanting dopants of a conductivity type (P or N) which is complementary (N or P) to the conductivity type of the semiconductor substrate using a patterned gate as a mask. The source and drain regions are thus self-aligned to the gate electrode, improving packing density and reducing parasitic overlap capacitances between the gate electrode and the source and drain.

Photolithographic techniques are commonly used to create patterns in the photoresist mask that define the gate electrode. Typically, the wafer is cleaned and prebaked to drive off moisture and promote adhesion, an adhesion promoter is deposited on the wafer, a few drops of photoresist are deposited onto the spinning wafer to provide a uniform layer, the wafer is soft baked to drive off remaining solvents, the wafer is put into a photolithographic system and exposed to a radiation pattern, and then the photoresist is developed. Positive photoresist is typically used so that the developer removes the irradiated regions. The photoresist is hardbaked to improve resistance, and then the wafer is doped using an additive process, such as ion implantation, or a subtractive process, such as etching, using the photoresist as a mask. The photoresist is then stripped.

Figure 6B:
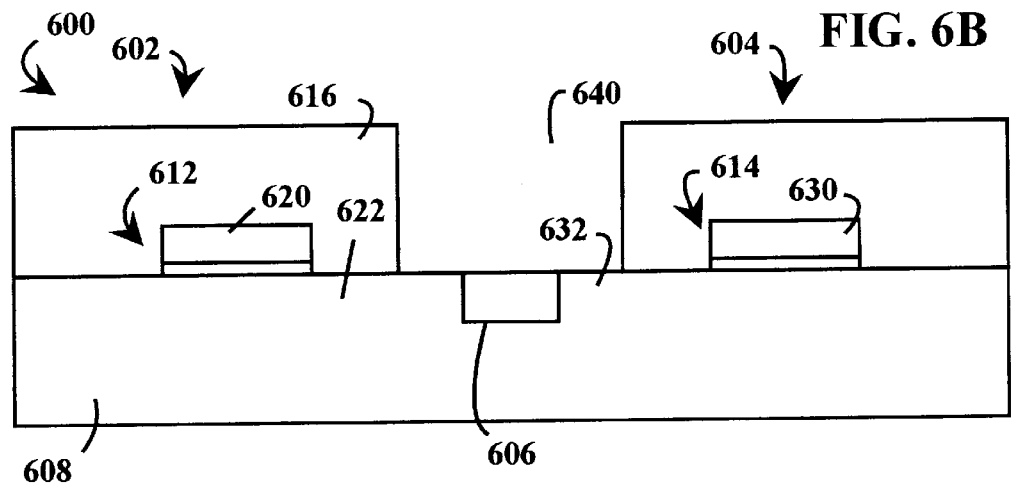
Figure 7:
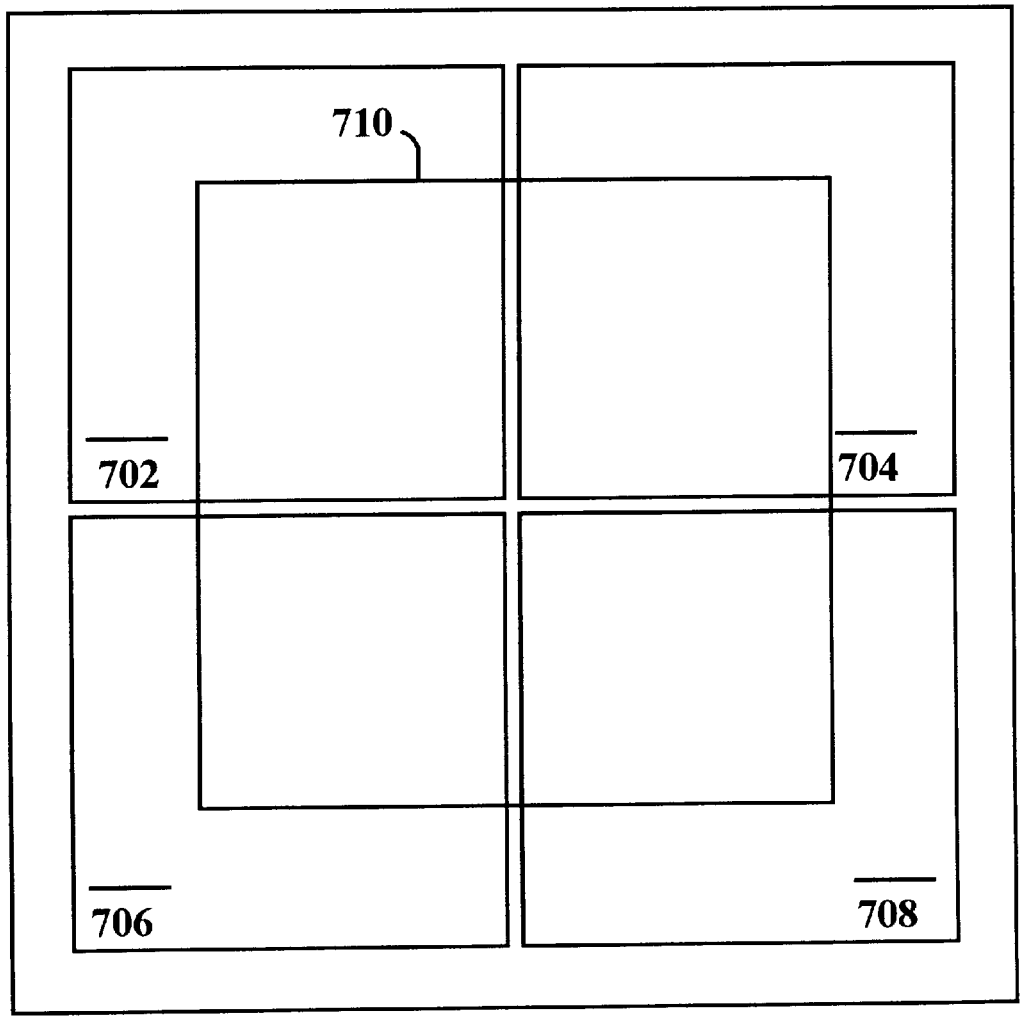
FIG. 7 is an overhead view of a semiconductor wafer showing four fields or regions which may use a stitch mask that covers all four fields to connect the fields.

Referring to FIG. 6B, a cross-sectional view of the semiconductor wafer 600 shows a field A 602 and a field B 604 following masking and etching of the dielectric layer 616 using a stitch mask which is applied in accordance with the technique disclosed in the discussion of paired FIGS. 1A and 1B through 5A and 5B. The stitch mask and etch operation is applied throughout the entire wafer surface or in a portion of the wafer surface in various applications. A photoresist layer (not shown) is deposited as a continuous layer and is irradiated using a photolithographic system. In one embodiment of a fabrication method, the photolithographic system is a step and repeat optical projection system where I-line ultraviolet light from a mercury-vapor lamp is projected through a reticle and a focusing lens to imposed a selected image pattern in the photoresist layer. The stitch mask overlaps both the field A 602 and the field B 604. In some embodiments, the stitch mask covers both the field A 602 and the field B 604. In embodiments including many circuit fields, the stitch mask may cover all fields. For example, an overhead view of a semiconductor wafer 700 shown in FIG. 7 shows four fields A 702, B 704, C 706, and D 708 which may use a stitch mask 710 that covers all four fields. In other embodiments, the stitch mask covers a same size area or a smaller area than the area of a single of the fields A 602 and B 604 but is positioned to overlap field A 602 and field B 604.

The stitch mask is applicable in circumstances in which field A 602 and field B 604 are formed using different masks. If field A 602 and field B 604 can be formed using a single mask, a stitch mask is not necessary.

In various embodiments, the stitch mask is applied using a reticle that has the same resolution as the reticles for masking field A 602 and field B 604 or a different resolution. In some embodiments, field A 602 and field B 604 are masked using a 4× or 5× reticle. A stitch mask that covers both the entire field A 602 and field B 604 may, for example, be applied using a large 1× reticle. A large 1× reticle does not attain the resolution of a 4× or 5× reticle, but the registration tolerances to be attained by the stitch mask are not critical in comparison to the tolerances in the field A 602 and the field B 604.

The photoresist layer is developed and the irradiated portions are removed to form openings including a via 640 in the dielectric layer 616. The dielectric layer 616 is etched to selectively expose the source/drain regions of transistors so that the source/drain regions are subsequently connected. In the illustrative example, the source/drain region 622 of transistor A 612, the source/drain region 632 of transistor B 614 and the isolation 606 separating field A 602 and field B 604 are uncovered by etching of the dielectric layer 616. The dielectric layer 616 is masked using a stitch mask traversing a plurality of separately masked field areas A 602 and B 604 and etched to form the via 640 for making a local interconnect between devices transistor A 612 and transistor B 614 crossing the isolation 606.

Figure 6C:
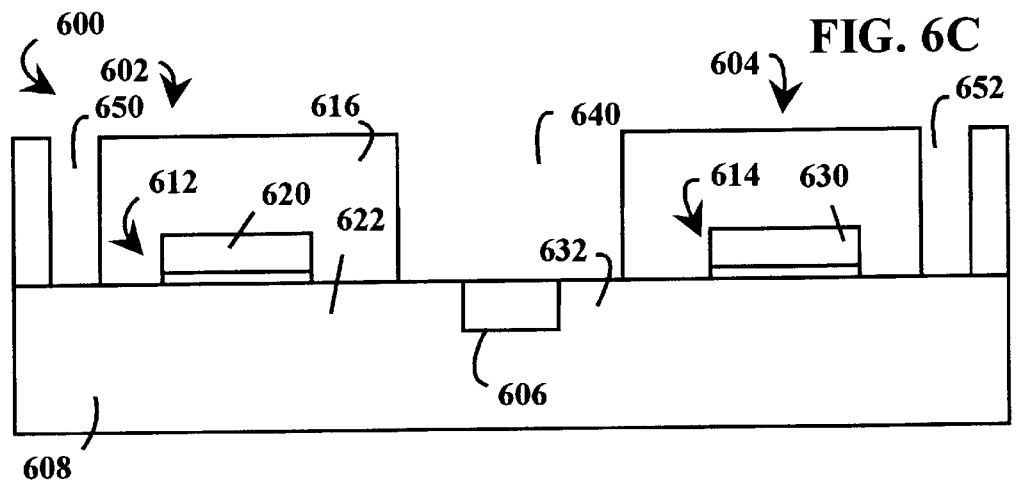

Referring to FIG. 6C, a cross-sectional view of the semiconductor wafer 600 shows a field A 602 and a field B 604 following masking and etching of the dielectric layer 616 using two contact masks, one applied to field A 602 and one applied to field B 604. The contact mask steps are performed to form a contact via 650 to transistor A 612 and a contact via 652 to transistor B 614.

Figure 6D:
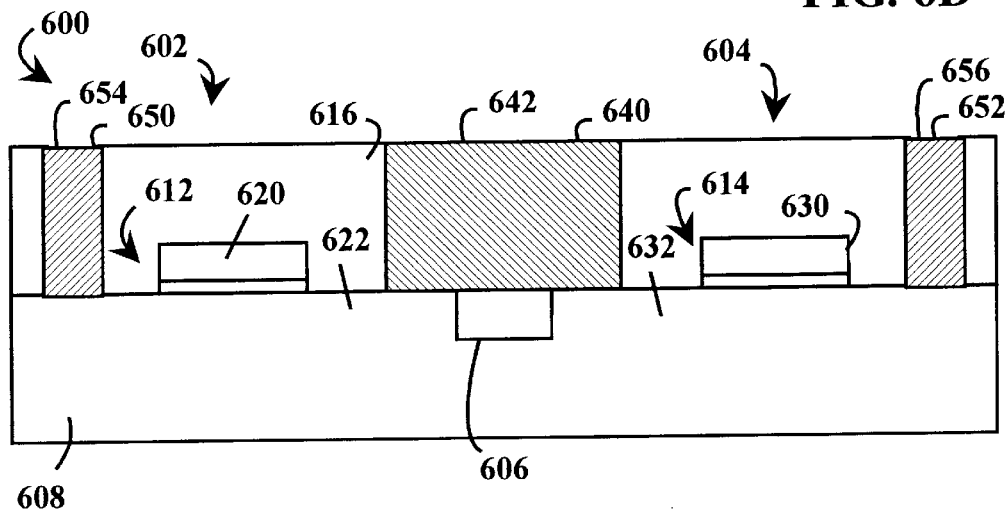

Referring to FIG. 6D, a metal plug 642 is formed in the via 640 formed by etching following application of the stitch mask and metal plugs 654 and 656 are also formed in the respective vias 650 and 652 formed by the contact mask and etch steps. The metal plugs are typically formed from tungsten or aluminum. The metal plug 642 forms a low impedance local interconnect between source/drain regions of transistors in separately masked and etched fields A 602 and B 604. The metal plugs 654 and 656 are formed using a suitable technique such as a chemical-vapor deposition (CVD) or plasma-enhanced chemical-vapor deposition (PECVD) technique followed by chemical-mechanical polishing (CMP), simultaneous deposition of a metal-1 layer and the plug film followed by two-mask patterning of the plug and metal-1 lines, or etching of the plugs from a thin metal film using contrast-enhancement lithography.

Subsequent processing of the metal plugs depends on the circuit application. In some embodiments, a polishing step such as a chemical-mechanical polishing (CMP) is applied after formation of the metal plugs. CMP involves simultaneous chemically etching and mechanical polishing or grinding of a surface so that a combined chemical reaction and mechanical polishing removes a desired material from the substrate surface in a controlled manner. The resulting structure is a planarized substrate surface with protruding surface topography leveled. CMP is typically performed by polishing a substrate surface against a polishing pad that is soaked with a slurry including an acidic or basic solvent, an abrasive agent and a suspension fluid. In other embodiments, polishing is not performed and the metal plug 642 is simply filled and capped with a topside metal layer. In some embodiments, the metal plug 642 is deposited and planarized or formed by a continuous aluminum fill.

Figure 6E:
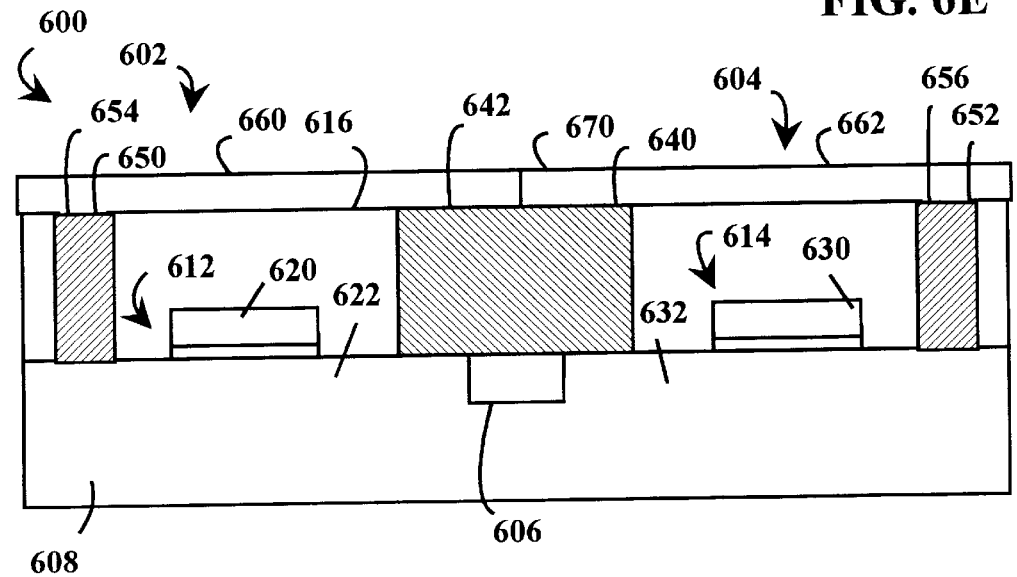

Referring to FIG. 6E, a cross-section view of the semiconductor wafer 600 illustrates the formation of a metal line A 660 printed on the field A 602 and a metal line B 662 printed on the field B 604, forming a local-interconnect layer 670 by depositing a metal such as aluminum or tungsten and defining the layer. In one embodiment, the metal line A 660 and the metal line B 662 are formed by deposition of hot aluminum, tungsten or other suitable metal and polished. The metal line A 660 and the metal line B 662 may be deposited by chemical vapor deposition (CVD), sputter-deposition, or by evaporated-film deposition. CVD deposition attains a better step coverage. CVD of tungsten is typically performed in either a hot-wall, low-pressure CVD system or a cold-wall low-temperature system. The tungsten is selectively deposited from either $WF_6$ or $WCl_6$ using hydrogen reduction-blanket CVD W deposition and etchback. CVD of aluminum is typically performed by pyrolysis of triisobutyl aluminum (TIBA) or by selective deposition through thermal decomposition of TIBA.

While the invention has been described with reference to various embodiments, it will be understood that these embodiments are illustrative and that the scope of the invention is not limited to them. Many variations, modifications, additions and improvements of the embodiments described are possible. For example, although the illustrative connections are made with source/drain regions of transistors, the disclosed method is applicable to structures other than source/drain regions and transistor devices. Any interconnections made be made using the disclosed method.

What is claimed is:

1. A method of fabricating an integrated circuit comprising the steps of:

fabricating a plurality of mutually disconnected and nonoverlapping semiconductor device regions on a substrate wafer, the semiconductor device regions being electrically isolated by an isolation;

individually masking and etching ones of the plurality of mutually disconnected and nonoverlapping semiconductor device regions;

forming a dielectric layer on the substrate wafer overlying the disconnected and nonoverlapping semiconductor device regions;

masking and etching the dielectric layer so that a via is formed between a device in a first semiconductor device region and a device in a second semiconductor device region; and filling the via with a conductive material forming an electrical connection between the first semiconductor device region and the second semiconductor device region.

2. A method according to claim 1 wherein the via is connected to a source/drain region of a transistor in the first semiconductor device region.

3. A method according to claim 2 wherein the via is connected to a source/drain region of a transistor in the second semiconductor device region.

4. A method according to claim 1 wherein the plurality of mutually disconnected and nonoverlapping semiconductor device regions are individually masked using a reticle and lens confining a mask image to the corresponding semiconductor device region.

5. A method according to claim 1 wherein the dielectric layer is masked using a reticle and lens generating a mask image overlapping a plurality of the disconnected and nonoverlapping semiconductor device regions.

6. A method according to claim 1 wherein the via is filled using a conductive metal plug.

7. A method according to claim 1 wherein the isolation is a field oxide isolation.

8. A method according to claim 1 wherein the isolation is a trench isolation.

9. A method according to claim 1 wherein:

the plurality of mutually disconnected and nonoverlapping semiconductor device regions are individually masked using a reticle and lens confining a mask image to the corresponding semiconductor device region;

the dielectric layer is masked using a reticle and lens generating a mask image overlapping a plurality of the disconnected and nonoverlapping semiconductor device regions; and the device region reticles and the overlapping reticle have the same resolution.

10. A method according to claim 1 wherein:

the plurality of mutually disconnected and nonoverlapping semiconductor device regions are individually masked using a reticle and lens confining a mask image to the corresponding semiconductor device region;

the dielectric layer is masked using a reticle and lens generating a mask image overlapping a plurality of the disconnected and nonoverlapping semiconductor device regions; and the resolution of the device region reticles is higher than resolution of the overlapping reticle.

11. A method according to claim 1 wherein the step of fabricating a plurality of mutually disconnected and non-overlapping semiconductor device regions includes the step of fabricating a plurality of different integrated circuits.

12. A method according to claim 1 wherein the step of fabricating a plurality of mutually disconnected and non-overlapping semiconductor device regions includes the step of fabricating a plurality of different integrated circuits including a P-channel circuit region and an N-channel circuit region.

13. A method according to claim 1 wherein the step of fabricating a plurality of mutually disconnected and non-overlapping semiconductor device regions includes the step of fabricating a plurality of different integrated circuits including a microprocessor and a memory.

14. A method according to claim 1 wherein the step of fabricating a plurality of mutually disconnected and non-overlapping semiconductor device regions includes the step of fabricating a plurality of different integrated circuits including a P-channel circuit region and an N-channel circuit region of a static RAM circuit.

15. A method of fabricating an integrated circuit comprising the steps of:

fabricating a plurality of semiconductor device regions on a substrate wafer;

forming an isolation between the plurality of semiconductor device regions;

individually masking ones of the plurality of semiconductor device regions;

individually etching the masked ones of the plurality of semiconductor device regions;

masking the substrate wafer using a mask that overlaps a plurality of the semiconductor device regions;

etching the masked substrate wafer so that a via is formed between a device in a first semiconductor device region and a device in a second semiconductor device region; and filling the via with a conductive material and forming an electrical connection between the first semiconductor device region and the second semiconductor device region.

16. A method according to claim 15 wherein:

the plurality of semiconductor device regions are individually masked using a reticle and lens confining a mask image to the corresponding semiconductor device region;

the substrate wafer is masked using a reticle and lens generating a mask image overlapping a plurality of the semiconductor device regions; and the device region reticles and the substrate reticle have the same resolution.

17. A method according to claim 15 wherein:

the plurality of semiconductor device regions are individually masked using a reticle and lens confining a mask image to the corresponding semiconductor device region;

the substrate wafer is masked using a reticle and lens generating a mask image overlapping a plurality of the semiconductor device regions; and the resolution of the device region reticles is higher than resolution of the substrate reticle.

18. A method of fabricating an integrated circuit comprising:

for a plurality of semiconductor device regions, defining structures within the device region using a reticle;

imaging exposure fields to form devices in the plurality of device regions;

mutually electrically isolating the plurality of device regions using an isolation; and forming interconnections among the plurality of device regions by imaging using a stitching reticle having an exposure field overlapping at least a subset of the plurality of device regions.

19. A method according to claim 18 wherein the isolation is selected from between a field oxide isolation or a trench isolation.

20. A method according to claim 18 further comprising:

imaging the exposure fields for the plurality of device regions using a step and repeat technique to increase the size of a combined device region field while attaining a high imaging resolution within the combined device region field.

21. A method according to claim 18 further comprising:

fabricating one or more integrated circuit functional elements in a corresponding one or more individual device regions of the plurality of device regions; and interconnecting the one or more integrated circuit functional elements using a stitch mask and etch operation.

22. A method according to claim 21 wherein:

the one or more integrated circuit functional elements include a microprocessor functional element, a memory functional element, and a support function functional element.

* * * * *